United States Patent
Patel et al.

(10) Patent No.: US 11,762,155 B2
(45) Date of Patent: Sep. 19, 2023

(54) PHOTONICS PACKAGING PLATFORM

(71) Applicant: Cisco Technology, Inc., San Jose, CA (US)

(72) Inventors: Vipulkumar K. Patel, Breinigsville, PA (US); Matthew J. Traverso, Saratoga, CA (US); Sandeep Razdan, Burlingame, CA (US); Aparna R. Prasad, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 17/445,914

(22) Filed: Aug. 25, 2021

(65) Prior Publication Data
US 2023/0060862 A1    Mar. 2, 2023

(51) Int. Cl.
G02B 6/42    (2006.01)

(52) U.S. Cl.
CPC .......... *G02B 6/423* (2013.01); *G02B 6/4202* (2013.01)

(58) Field of Classification Search
None
See application file for complete search history.

(56) References Cited

U.S. PATENT DOCUMENTS

| | | | |
|---|---|---|---|
| 8,971,676 B1* | 3/2015 | Thacker | G02B 6/4274 385/14 |
| 9,995,881 B1 | 6/2018 | Patel et al. | |
| 10,288,812 B1 | 5/2019 | Evans et al. | |
| 11,107,770 B1* | 8/2021 | Ramalingam | H01L 25/18 |
| 11,107,799 B1* | 8/2021 | Alapati | H01L 23/36 |
| 11,493,714 B1* | 11/2022 | Mendoza | H01L 25/0657 |
| 2005/0189631 A1* | 9/2005 | Masumoto | G02B 6/4253 257/678 |
| 2012/0207426 A1* | 8/2012 | Doany | G02B 6/426 257/E33.056 |
| 2013/0308898 A1* | 11/2013 | Doerr | G02B 6/428 385/14 |

(Continued)

FOREIGN PATENT DOCUMENTS

| | | |
|---|---|---|
| JP | 2014206572 A | 10/2014 |
| WO | 2020216916 A1 | 10/2020 |

OTHER PUBLICATIONS

Rakesh Chopra, "Co-Packaged Optics and an Open Ecosystem," Cisco Blogs / SP360: Service Provider, dated Jan. 11, 2021, pp. 1-12.

(Continued)

*Primary Examiner* — Michael Stahl
(74) *Attorney, Agent, or Firm* — Patterson + Sheridan, LLP

(57) ABSTRACT

Embodiments herein describe an optical system that includes a photonic integrated circuit (PIC) bonded to a package containing an electrical integrated circuit (EIC). However, this bond can prevent an edge coupler from optically aligning an optical fiber to an edge of the PIC in order to transfer optical signals. To provide room for the edge coupler, the PIC is arranged to overhang the package containing the EIC so that the package does not interfere with the ability of the edge coupler to align with the side or edge of the PIC. In this manner, an optical fiber can be optically aligned (e.g., butt coupled) to the edge of the PIC rather than having to use a grating coupler or some other less efficient optical coupling in order to transfer optical signals between the PIC and the optical fiber.

20 Claims, 6 Drawing Sheets

(56) References Cited

U.S. PATENT DOCUMENTS

| | | | |
|---|---|---|---|
| 2014/0064659 A1 | 3/2014 | Doerr et al. | |
| 2016/0085038 A1 | 3/2016 | Decker et al. | |
| 2016/0124164 A1 | 5/2016 | Doerr | |
| 2018/0045885 A1* | 2/2018 | Canali | H01L 23/13 |
| 2018/0275359 A1* | 9/2018 | Ding | H01L 24/81 |
| 2018/0348434 A1* | 12/2018 | Yim | H01L 24/32 |
| 2019/0044002 A1* | 2/2019 | Byrd | G02B 6/428 |
| 2019/0121041 A1* | 4/2019 | Albers | G02B 6/4232 |
| 2019/0137706 A1 | 5/2019 | Xie | |
| 2019/0285804 A1* | 9/2019 | Ramachandran | G02B 6/421 |
| 2019/0333905 A1* | 10/2019 | Raghunathan | G02B 6/4274 |
| 2020/0219865 A1* | 7/2020 | Nelson | G02B 6/4266 |
| 2020/0264391 A1 | 8/2020 | Tummidi | |
| 2020/0365544 A1* | 11/2020 | Chen | H01L 23/5385 |
| 2021/0088723 A1 | 3/2021 | Yu et al. | |
| 2021/0096310 A1* | 4/2021 | Chang | G02B 6/43 |
| 2021/0132309 A1* | 5/2021 | Zhang | G02B 6/4249 |
| 2021/0225824 A1* | 7/2021 | Islam | H01L 23/367 |
| 2021/0288035 A1* | 9/2021 | Liljeberg | H01L 24/17 |
| 2021/0407909 A1* | 12/2021 | Jadhav | H01L 23/5381 |
| 2022/0196935 A1* | 6/2022 | Li | G02B 6/4214 |
| 2022/0342150 A1* | 10/2022 | Karhade | G02B 6/12002 |

OTHER PUBLICATIONS

Nitin Dahad, "Data Demands Drive Co-Packaged Silicon and Optics for Switch Fabrics," EE Times, Designlines, AI & Big Data Designline, dated Mar. 12, 2020, pp. 1-3.

International Search Report and Written Opinion for PCT Application No. PCT/US2022/074740, dated Dec. 12, 2022.

Abrams Nathan C et al: "Silicon Photonic Multi-Chip Module Interconnects for Disaggregated Data Centers", 2020 International Conference on Optical Network Design and Modeling (ONDM), IFIP, May 18, 2020 (May 18, 2020), pp. 1-3, XP033789728, DOI: 10.23919/ONDM48393.2020.9133003 [retrieved on Jul. 2, 2020] figure 1 p. 3, section B. Integration.

* cited by examiner

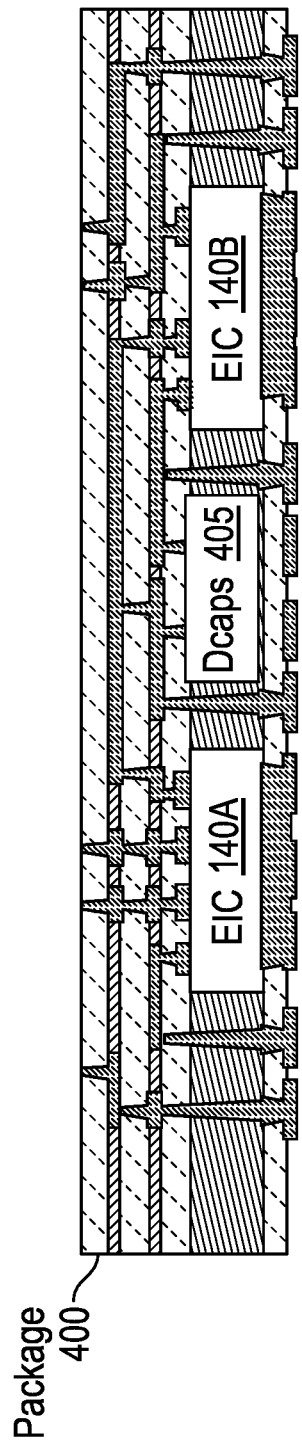
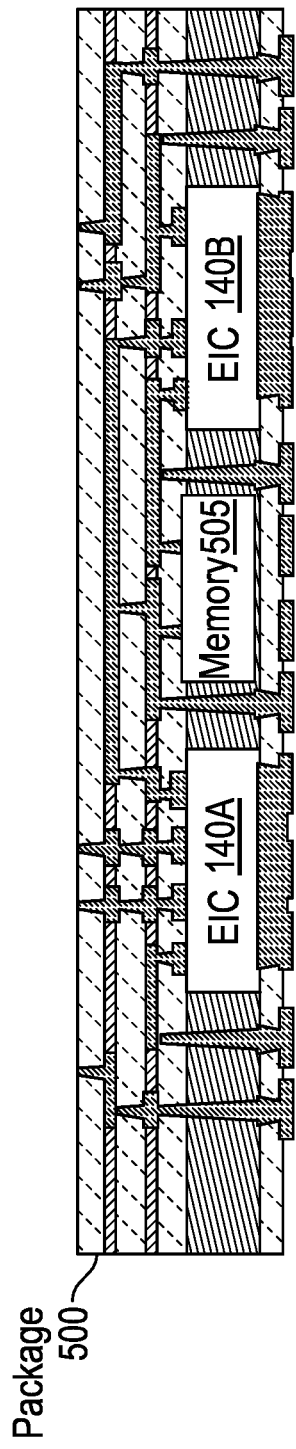
FIG. 4
FIG. 5

PHOTONICS PACKAGING PLATFORM

TECHNICAL FIELD

Embodiments presented in this disclosure generally relate to optical systems and more specifically, to optical system with photonic and electrical integrated circuits (ICs).

BACKGROUND

Optical systems typical includes photonic ICs (PICs) (also referred to as photonic chips) that are connected to electrical ICs (EICs) containing circuitry for driving optical components in the PICs such as optical modulators or receiving electrical signals generated by optical detectors in the PICs. A combination of a PIC and EIC is sometimes also known as Optical Engine (OE). An optical interface (lasers and/or Fibers/Fiber arrays are attached to the OEs in order to facilitate light to be coupled in and out of the OE. Traditionally, large application specific integrated circuits (ASICs) are typically packaged on a large organic substrate mounted on a printed circuit board while the OEs are segregated into pluggable modules. However, as data rates (speeds) increase and the electrical power used to transport the high speed signals on PCB larger distances becomes prohibitive, co-packaging of the OEs and these large ASICs into the same package can lead to many advantages such as power savings, space savings, and overall cost reduction.

However, co-packaging of OEs with ASICs requires optimization of the OE package in order to realize the benefits offered by co-packaging. The components of the OE (PIC, EICs, decoupling capacitors, fiber array units (FAU), etc.) have to be packaged using methods that are compatible with co-packaging with ASICs. As the PICs and EICs are made using the different wafer processing technologies, the electrical connections between them are made using wire bonds, copper micro-bumps or any other methods. Microbumps provide significant advantages in terms of speed and density over traditional wire bond connections and are preferred in OE assembly. Packaging compatible FAU attachment, warpage of the organic substrate and heat removal form the EICs are other consideration that should be taken into account in the design of an OE.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

FIGS. 4, 5, and 6 illustrate packages containing different ICs, according to an embodiment.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

One embodiment presented in this disclosure is a system that includes a PIC, a package containing at least one EIC where the package is bonded to a first side of the PIC such that an overhang of the PIC extends beyond the package, and an optical fiber optically aligned to a second side of the PIC that is on the overhang, wherein the second side is perpendicular to the first side of the PIC.

Another embodiment presented in this disclosure is a system that includes a PIC, a package containing at least one EIC where the package is bonded to a first side of the PIC such that an overhang of the PIC extends beyond the package. Further, a second side of the PIC, which is perpendicular to the first side of the PIC and on the overhang, is an optical interface configured to be coupled to an optical fiber.

Another embodiment presented in this disclosure is a system that includes a PIC and a package containing at least one EIC electrically connected to the PIC. The package is bonded to a first side of the PIC such that a second side of package is recessed relative to a third side of the PIC and the second and third sides face a same direction and are perpendicular to the first side. Further, the third side of the PIC is an optical interface configured to be coupled to an optical fiber.

Example Embodiments

Embodiments herein describe an optical system where a PIC is co-packaged with an EIC. In one embodiment, the PIC is bonded to a package (e.g., a reconstituted wafer) containing the EIC. However, this bond can prevent an edge coupler from optically aligning an optical fiber to an edge of the PIC in order to transfer optical signals. To provide room for the edge coupler, the PIC is arranged to overhang the package containing the EIC so that the package does not interfere with the ability of the edge coupler to align with the side or edge of the PIC. In this manner, an optical fiber (e.g., a FAU) can be optically aligned (e.g., butt coupled) to the edge of the PIC rather than having to use a grating coupler or some other less efficient optical coupling in order to transfer optical signals between the PIC and the optical fiber.

Figure 1:
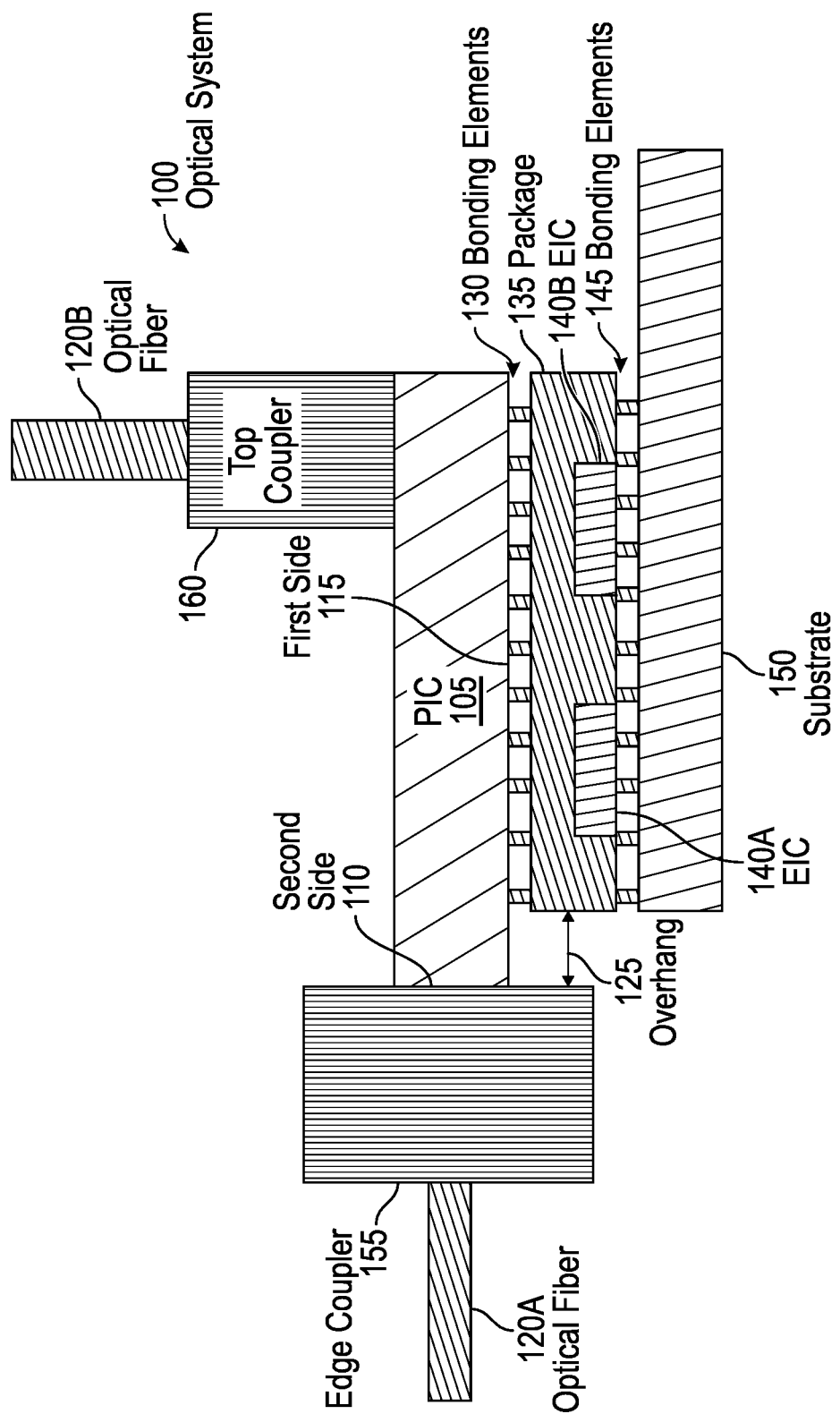
FIG. 1 illustrates an optical system with a PIC overhanging a package containing an EIC, according to an embodiment.

FIG. 1 illustrates an optical system 100 (e.g., an optical package) with a PIC 105 overhanging a package 135 containing at least one EIC 140, according to an embodiment. The PIC 105 can be any semiconductor material that includes optical components such as waveguides, optical modulators, optical detectors, and the like. The optical components can be disposed or formed in an active surface layer of the PIC 105. The optical component may include a silicon or silicon nitride waveguide(s) or a Mach-Zehnder Interferometer (MZI) and may be include a different material such as a germanium detector integrated into a silicon active surface layer.

The PIC 105 can include a semiconductor substrate (e.g., a silicon substrate) that supports the optical components or components in the PIC 105. This substrate can provide mechanical support to the optical components as well as to the optical system 100 as a whole. For example, the substrate in the PIC 105 can help to avoid warpage as the temperature of the optical system 100 fluctuates during operation (e.g., as the EICs 140 generate heat) or when the optical system 100 is being assembled (e.g., when the PIC 105 is bonded, at a first side 115, to the package 135 using a solder bonding process). In one embodiment, the thickness of the PIC 105 is at least 400 microns. In another embodiment, the PIC 105 has a thickness greater than 700 microns. In one embodiment, the thickness of the PIC 105 is selected to provide sufficient area and strength to attach an edge coupler 155 to a second side 110 of the PIC 105.

FIG. 1 illustrates bonding elements 130 that bond the PIC 105 to the package 135 containing the EICs 140A and 140B. The bonding elements 130 can include solder connections such as solder bumps or micro bumps. The bonding elements 130 can also include other bonding structures such as under bump metallization (UBM) and metal pillars (e.g., copper pillars) for facilitating the solder connections. However, the embodiments herein are not limited to any particular technique or method for bonding the package 135 to the PIC 105 so long that the bonding provides electrical connections so that electrical signals can be transferred therebetween. The bonding elements 130 can also provide mechanical support for the optical system 100.

In this example, the package 135 contains two EICs 140 that are electrically connected to the PIC 105. The EICs 140 can transmit electrical signals to the PIC 105 as well as receive electrical signals from the PIC 105. For example, the EICs 140 can provide drive signals for an optical modulator in the PIC 105 to modulate an optical signal. Or the EICs 140 can receive an electrical signal provided by a photodetector in the PIC 105. In one embodiment, the PIC 105 and the EICs 140 are part of an optical transmitter, receiver, or transceiver.

In one embodiment, the EICs 140 are thinned before being disposed in the package 135. For example, the EICs 140 may have a thickness less than 100 microns. The EICs 140 made using different process technologies (i.e. CMOS, BiCMOS, memory, SiGe, etc.). Within the same process technology, multiple IC can also be integrated in order to achieve desired overall functionality and size of the package 135.

Although two EICs 140 are shown, the package 135 can contain any number of EICs as well as other components. Different implementations of the package 135 are described in FIGS. 4-6 below. In one embodiment, the package 135 is a reconstituted wafer or package (also referred to as an EIC complex) that can have through vias, metal routing layers, etc. for routing electrical signals between the EICs 140 and the PIC 105 as well as a substrate 150. For example, the reconstituted wafer can include a dielectric molding material that encases the EICs 140 to provide mechanical support. The reconstituted wafer also can include through vias (within the dielectric molding material and multilayer metallization (redistribution layers) formed above the dielectric molding material to provide electrical connections between the EICs, PIC and the substrate.

While co-packaging the PIC 105 to the package 135 containing the EICs 140 reduces space and can reduce cost, it also can make it difficult to optically align an optical fiber 120A to the PIC 105, especially when using edge coupling. That is, if the PIC 105 were directly aligned with the package 135 (where the sides of the respective components share the same planes) or if the second side 110 of the PIC 105 (which serves as an optical interface) was directly above the package 135, then the package 135 can block the edge coupler 155 from abutting the second side 110. That is, if the left side of the package 135 protrudes further to the left in FIG. 1 than the second side 110 of the PIC 105 then the bottom portion of the edge coupler 155 may contact the side of the package 135 which causes the edge coupler 155 to contact the second side 110 at an angle rather than being flush with the side 110. This is because many types of edge couplers 155 have thicknesses that are greater than the thickness of PIC 105. For example, an edge coupler 155 may have a thickness of several millimeters while the thickness of the PIC 105 is less than 800 microns, and in one embodiment, is less than 400 microns.

To enable the edge coupler 155 to contact the PIC 105 without also contacting the package 135, a portion of the PIC 105 overhangs the package 135 as shown by the overhang 125. While FIG. 1 illustrates that the PIC 105 has a width larger than the package 135, the overhang 125 can be achieved even when the width of the PIC 105 is less than the width of the package 135 by shifting the PIC 105 to the left. In general, the width of a typical PIC is sufficient to establish the overhang 125 and still have a suitable number of bonding elements 130 for making a mechanical connection to the package 135. Being able to optically align the optical fiber 120A to the edge of the PIC 105 so it is in line with an optical waveguide in the PIC 105 can provide better coupling efficiency than coupling an optical fiber into a top side of the PIC 105. However, FIG. 1 illustrates that the optical system 100 can also include a top coupler 160 which optically couples an optical fiber 120B to a top surface of the PIC 105, which is parallel to the bottom surface of the PIC 105 coupled to the package 135. The top coupler 160 can be a grating coupler or some other type of fiber array unit. The top coupler 160 is optional and may be omitted in some embodiments. Although the top coupler 160 may not be as efficient as the edge coupler 155, it is one option for increasing the number of optical signals that can be transmitted into, or received from, the PIC 105.

In one embodiment, the package 135 (e.g., a reconstituted wafer) is flip chip attached to the first side 115 of the PIC 105, allowing for the second side 110 of the PIC 105 to be exposed post packaging (i.e. PIC 105 edge extends out on at least one of the four sides that are perpendicular to the first side 115 facing the package 135).

The package 135 is bonded on an opposite side to the substrate 150 using bonding elements 145, which can be any of the types discussed above. The bonding elements 130 and 145 can be the same, or different. For example, micro solder bumps may be used as the bonding elements 130 for bonding the PIC 105 to the package 135 while C4 solder bumps are used as the bonding elements 145 to bond the package 135 to the substrate 150.

The substrate 150 can be an organic substrate, ceramic, or interposer (e.g., a semiconductor interposer). Although not shown, the substrate 150 can include electrical routing 240 (e.g., metal layers and vias) for transferring electrical signals with the package 135, and more specifically, with the EICs 140 in the package 135. In one embodiment, the substrate 150 can transmit and receive electrical signals with the PIC 105 without those signals being received in the EICs 140. For example, the package 135 may include bypass routes for routing electrical signals between the substrate 150 and the PIC 105 without using the EICs 140.

In one embodiment, the substrate 150 allows for fanout and routing to desired pinmap configuration. However, the thickness of the edge coupler 155 may be such that if the substrate 150 is also not recessed relative to the second side 110 of the PIC like the package 135, then the edge coupler 155 would contact the substrate 150 which can prevent proper optical alignment at the second side 110. While not necessary in FIG. 1 (since the edge coupler 155 is the example is not thick enough to contact the substrate 150), the PIC 105 can also overhang the substrate 150. That is, the substrate 150 can be shifted so that its leftmost side is recessed relative to the second side 110 of the PIC 105.

Figure 2:
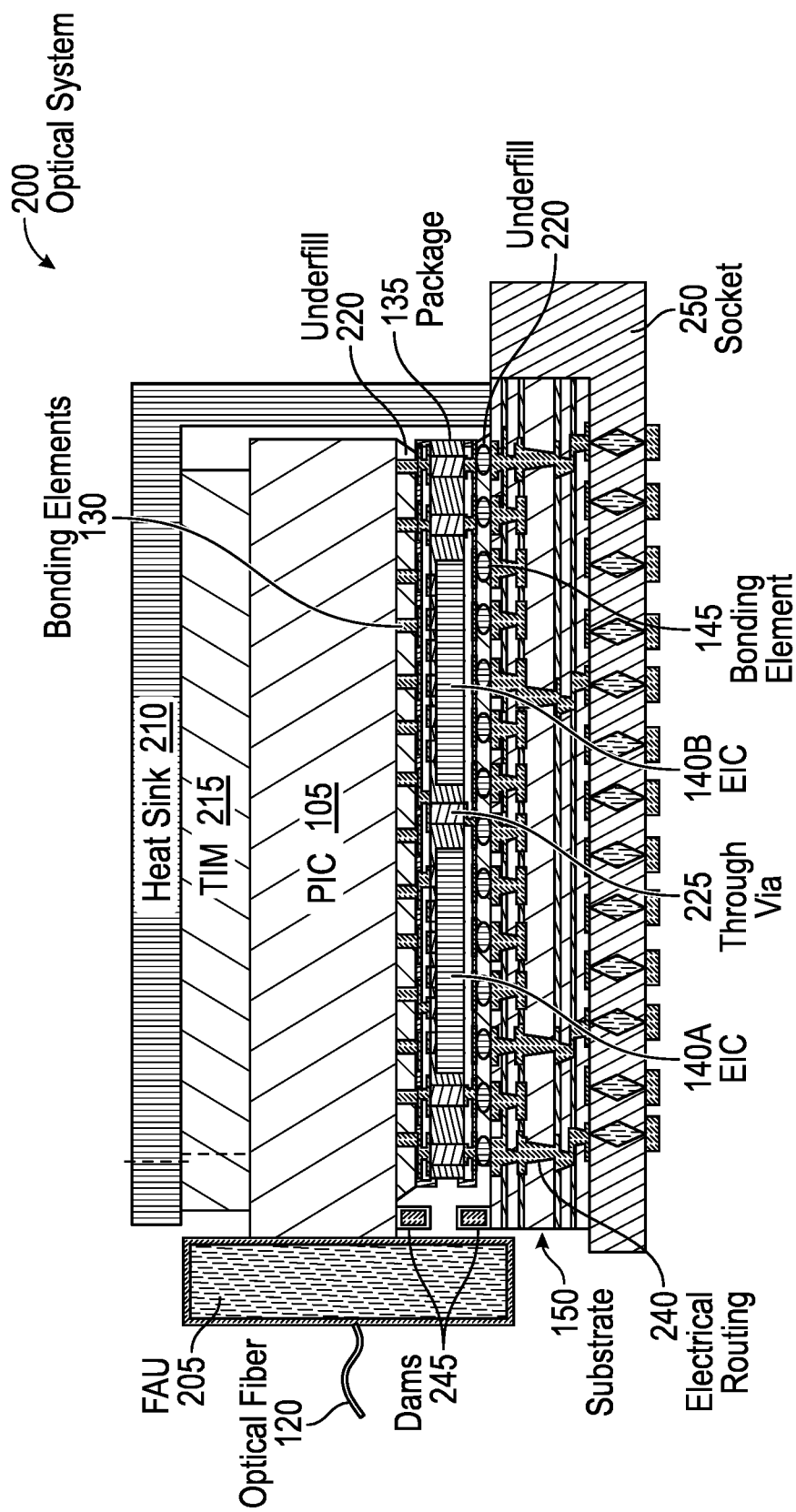
FIG. 2 illustrates an optical system with a PIC overhanging a package containing an EIC, according to an embodiment.

FIG. 2 illustrates an optical system 200 with the PIC 105 overhanging the package 135 containing multiple EICs 140, according to an embodiment. In addition to including the components in FIG. 1 (which have the same reference numbers), the optical system 200 includes a fiber array unit (FAU) 205, a heat sink 210, thermal interface material (TIM) 215, and a socket 250.

The FAU 205 is one example of an edge coupler which can be used to optically align the optical fiber 120 to the side of the PIC 105. Although one optical fiber 120 is shown, the FAU 205 can align multiple optical fibers to the PIC 105. These fibers 120 may be arranged in a row or line in the FAU 205, or couple be arranged in a grid (e.g., rows and columns). In any case, the embodiments herein are not limited to any particular type of edge coupler.

The TIM 215 provides a thermal interface between the PIC 105 and the heat sink 210. In one embodiment, the PIC 105 and the TIM 215 provide a thermal path to dissipate heat generated by the EICs 140. That is, heat generated by the EICs 140 can travel through the PIC 105 and the TIM 215 to reach the heat sink 210 for cooling the optical system 200. The TIM 215 can be made from any suitable material that provides a good thermal connection between the PIC 105 and the heat sink 210, such as a thermal paste or epoxy. The heat sink 210 can be air or liquid cooled and can be formed from any suitable material, e.g., a conductive metal. Further, the heat sink 210 can be used as a lid for the optical system 200 to protect the underlying components. Further, while FIG. 2 illustrates the heat sink 210 covering the entire top surface of the PIC 105, in another embodiment, the heat sink 210 may cover only a portion of the top surface to provide space for a top coupler (e.g., the top coupler 160 in FIG. 1) to be optically coupled to the PIC 105.

FIG. 2 also illustrates an underfill 220 that surrounds the bonding elements 130 that bond the PIC 105 to the package 135 and the bonding elements 145 that bond the package 135 to the substrate 150. This underfill 220 can provide additional mechanical support to these bonds. In one embodiment, the underfill 220 is applied is a liquid or semiliquid state after the bonds are formed where a capillary effect causes the underfill 220 to fill the space between the bonding elements 130 and 145. However, the underfill 220 can also flow outside of the area containing the bonding elements 130 and 145. If the underfill 220 flows too far to the left on the PIC 105, package 135, and substrate 150, it could protrude farther to the left than the left side of the PIC 105. Thus, when the FAU 205 is brought into optical alignment with the PIC 105, the FAU 205 may contact the underfill 220 that overflowed. As mentioned above, this can cause poor alignment between the optical fiber 120 and the PIC 105. Moreover, the optical alignment between the FAU 205 and the PIC 105 is improved by having a clean surface. If the underfill 220 reaches the left side of the PIC 105 it can reduce the coupling efficiency.

To mitigate the risk of the underfill 220 interfering with the alignment between the PIC 105 and the FAU 205 or from fouling the left side of the PIC 105, in this embodiment, the optical system 200 includes dams 245 on the PIC 105 and the substrate 150. If any overflow occurs, the underfill 220 is blocked by the dams so the underfill 220 cannot extend or protrude past the left side of the PIC 105, and as a result, does not interfere with the optical alignment. In general, the dams 245 can be disposed on the PIC 105 and the substrate 150 any time before the underfill 220 is applied. In one embodiment, the dam 245 on the PIC 105 is formed while the PIC 105 is being fabricated or processed but before the optical system 200 is assembled. The dams 245 can be formed from a polymer, under bump metal (UBM), and the like.

Further, the package 135 in FIG. 2 includes through vias 225 which can facilitate direct connections between the PIC 105 and the substrate 150 which bypass the EICs 140. That is, the PIC 105 and substrate 150 can exchange electrical signals without those signals passing through the EICs 140. In one embodiment, the through vias 225 are used to transfer power and signal integrity signals to the PIC 105. The through vias 225 can be form on the outside and between the EICs 140.

In one embodiment, the substrate 150 includes low resistance and low parasitic redistribution layers (RDLs) on one or both of its sides. In this example, the RDLs route electrical signals between the package 135 and the socket 250. In one embodiment, the socket 250 is a land grid array (LGA) socket. Although not shown, the bottom side of the socket 250 can be soldered attached to a PCB.

Figure 3:
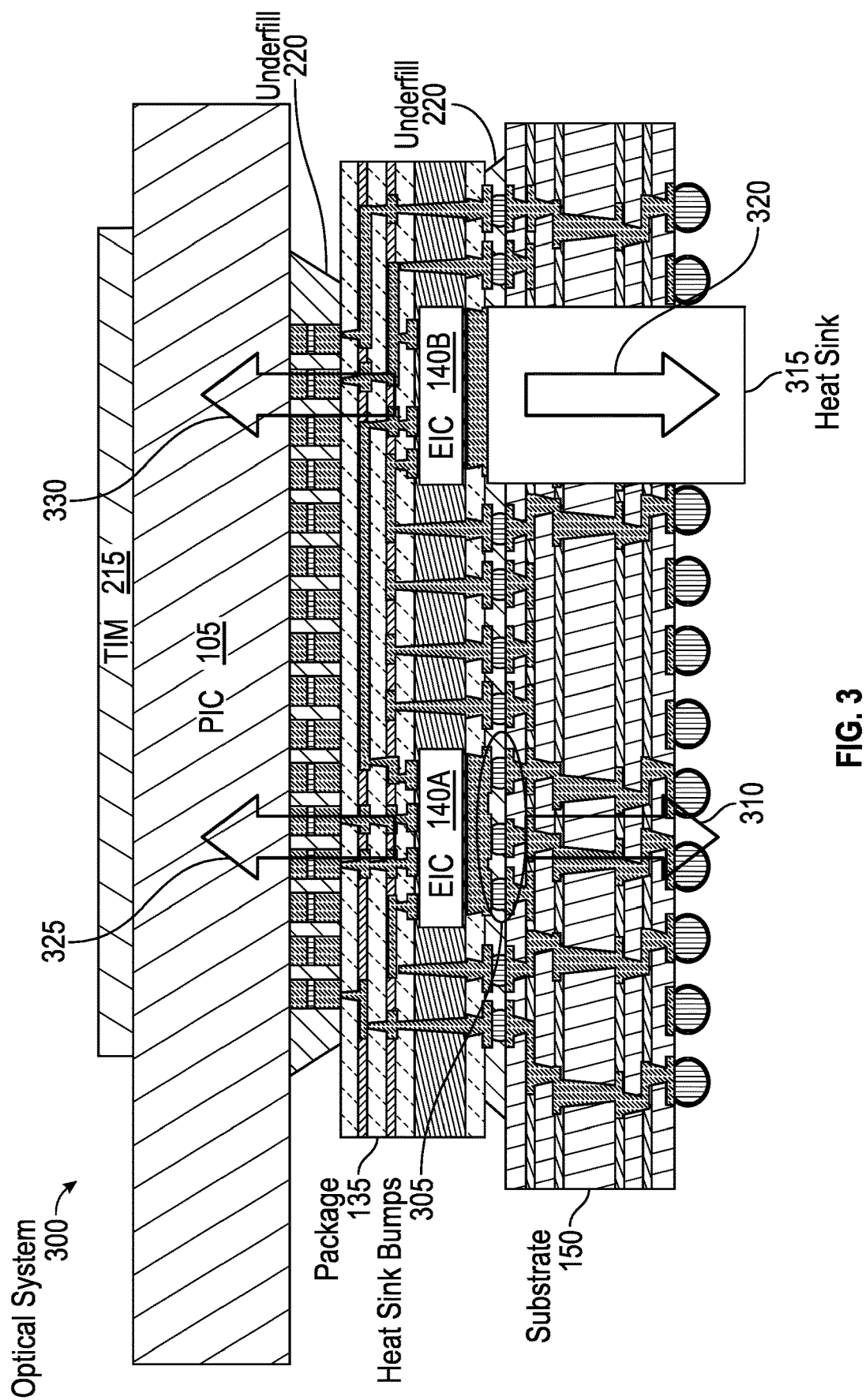
FIG. 3 illustrates heat dissipation in an optical system, according to an embodiment.

FIG. 3 illustrates heat dissipation in an optical system 300, according to an embodiment. As discussed above in FIG. 2, the optical system 200 includes the TIM 215 and heat sink 210 which can dissipate the heat generated by the EICs 140. The optical system 300 in FIG. 3 also includes this thermal path, which is illustrated by arrow 325 and 330, where the heat generated by the EICs 140 flows up through the package 135, the PIC 105, and the TIM 215 until eventually reaching the heat sink (not shown).

In addition to the thermal paths illustrated by the arrows 325 and 330, the optical system 300 includes other thermal paths illustrated by the arrows 310 and 320. Specifically, the arrows 310 and 320 illustrate two different techniques for providing thermals paths below the EICs 140. For the EIC 140A, heat sink bumps 305 are used to thermally couple the bottom side of the EIC 140A to the substrate 150. In one embodiment, the heat sink bumps 305 are used only for thermal transfer and do not carry electrical signals (although they could be dual purposed). The bumps 305 (e.g., solder bumps) provide a path for the heat to dissipate from the EIC 140 into the substrate 150. The metal routing in the substrate 150 (e.g., the RDLs and vias in the substrate 150) can then provide a path for the heat to flow through the substrate 150. Although not shown, a heat sink may be connected to the bottom of the substrate 150 (e.g., as part of the socket 250 in FIG. 2).

However, a different technique is used to form the thermal path illustrated by the arrow 320. Here, a portion of the substrate 150 directly beneath the EiC 140B is removed to form an aperture where a heat sink 315 is inserted. A top side of the heat sink 315 is thermally coupled to a bottom side of the EiC 140B either directly or by using thermally conductive elements in the package 135. Thus, rather than the heat having to dissipate through the substrate 150 to reach a heat sink as shown by the arrow 310, in this example, the heat generated by the EiC 140B can be directly transferred from the package 135 into the heat sink 315 which is integrated into the substrate 150.

While the optical system 300 illustrates using two different techniques to dissipate heat from the bottom side of the EICs 140, in other embodiments just one technique may be used—i.e., either placing the heat sink bumps 305 under each EIC 140 or inserting a heat sink under each EIC 140.

Figure 6:
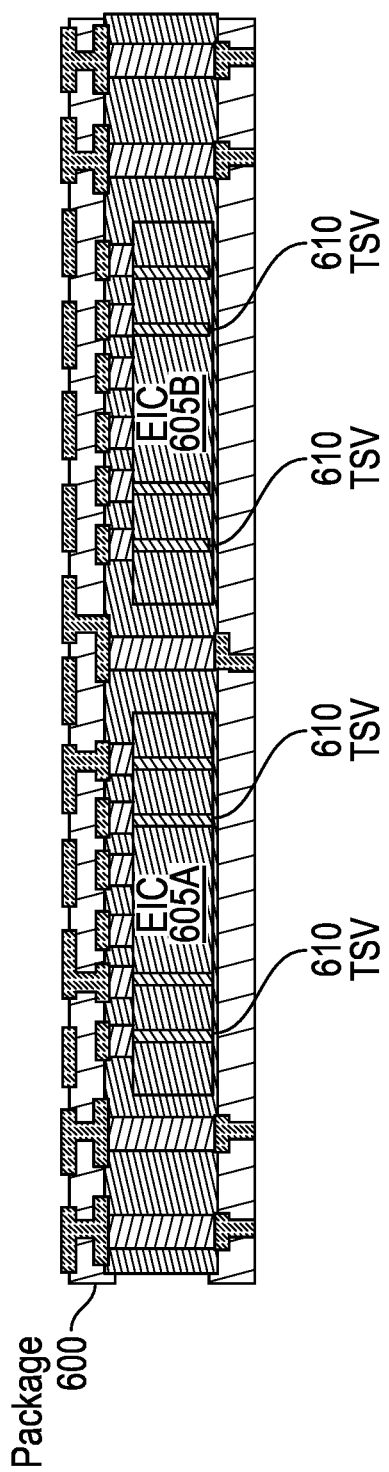

FIGS. 4, 5, and 6 illustrate different implementations of the package 135 discussed above. Specifically, FIG. 4 illustrates a package 400 containing EICs 140 and decoupling capacitors (Dcaps) 405, according to an embodiment. Dcaps 405 are commonly used for suppression of noise and are placed as close as possible to the device requiring the decoupled signals—e.g., the EICs 140. As data speed increases (e.g., 50 Gb/s to 100 Gb/s to 200 Gb/s), the rise time and fall time decreases which results in larger changes in current over time. This increases the need of larger Dcaps 405. Generally, larger Dcaps 405 means the Dcap value/unit area must be increased in order to keep the overall package area small.

Silicon based, area efficient DCaps (for example, 3D caps & high K dielectric caps) are available as independent wafer processing technology options. However, directly integrating Dcap processing modules into the PIC 105 or EIC 140 fabrication flow is challenging. In the package 400, high density Dcaps (which are integrated into a Dcap die) is integrated in the fanout package 400. The package 400 can use RDLs to then connect this die (and the Dcaps 405 therein) to the EICs 140 and the PIC 105.

Additionally or alternatively, other passive electrical components can be disposed in the package 400. For example, it may save cost or area to add a chip containing passive inductors or high-accuracy resistors into the package 135 which can then be connected to the EICs 140 and/or the PIC 105.

FIG. 5 illustrates a package 500 containing EICs 140 and a memory 505, according to an embodiment. In this example, the memory 505 is on a separate IC or chip than the EICs 140. Having built in memory 505 provides several advantages such as reduced access time, storing a self-contained optical engine with look up, and self-tuning capabilities.

The type of the memory 505 can include FLASH, RAM, ROM, and the like. The type of memory 505 can be selected depending on the application or architecture of the optical system. Further, stacked or 3D memories can also be integrated into the package 500.

FIG. 6 illustrates a package 600 containing EICs 140 with through silicon vias (TSVs) 610, according to an embodiment. As mentioned above, the EICs 140 in the package 600 may be thinned to have a thickness much smaller than the PIC. In one embodiment, the thinned EICs 140 can include the TSVs 610 which provide direct electrical connections from the top sides of the EICs 140 to their bottom sides. With the addition of the TSVs 610, electrical connections are not relegated to just the perimeter of the EICs 140, but can also originate from within the EICs 140.

Further, the RDLs in the package 600 can be retained for ease of routing to facilitate a pinmap for a large body ASIC substrate where the TSVs 610 provide additional routing. While FIG. 6 illustrates both of the EICs 140 having TSVs 610, the package 600 can include different process node EICs, some that have TSVs 610 while others do not.

Figure 7A:
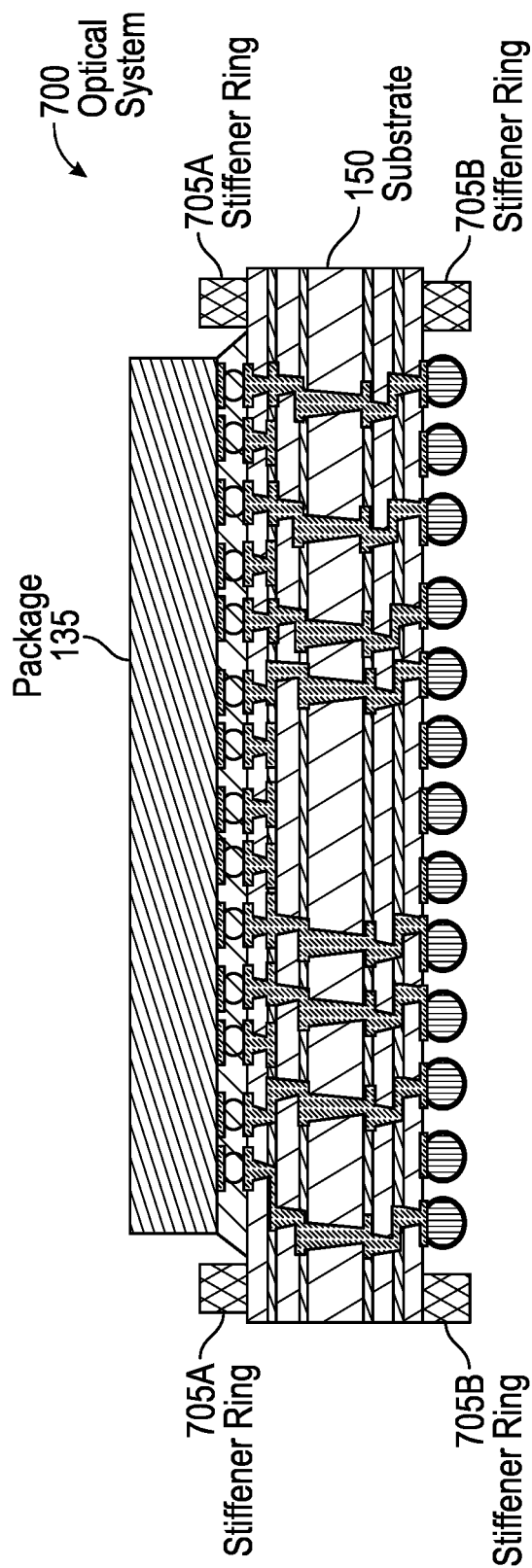
FIGS. 7A and 7B illustrate a stiffener ring for a substrate in an optical system, according to an embodiment.
Figure 7B:
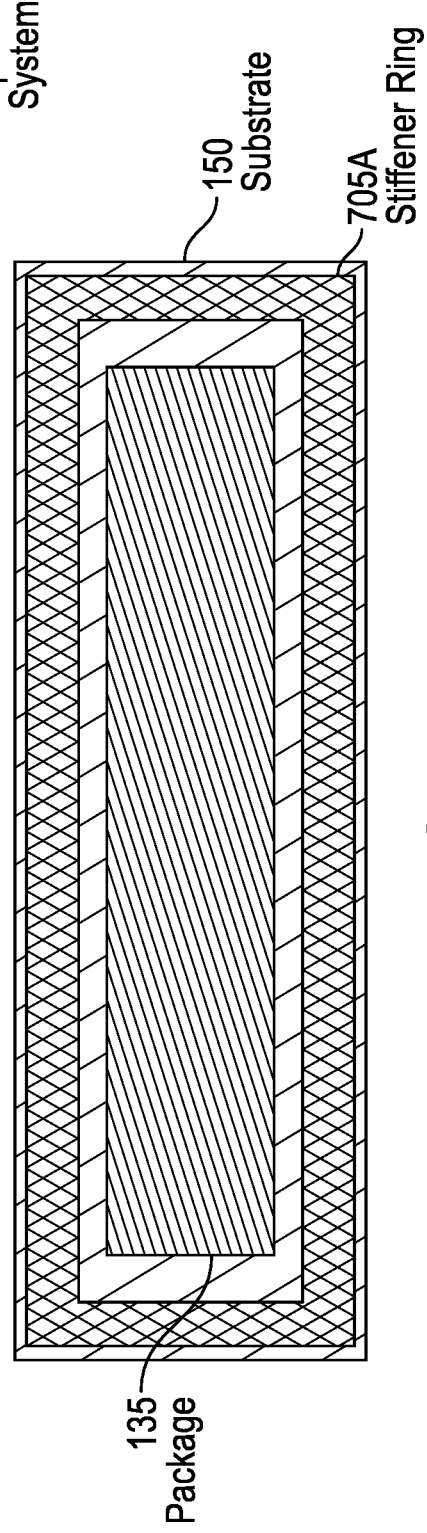

FIGS. 7A and 7B illustrate a stiffener ring 705 for the substrate 150 in an optical system 700, according to embodiments. Specifically, FIG. 7A illustrates a cross sectional view of the optical system 700 while FIG. 7B illustrates a top view of the system 700. For clarity, the optical system 700 has omitted the PIC, edge coupler (e.g., a FAU), the TIM, and the heat sink, but it is understood that it can include those components.

The stiffener rings 705 can help prevent or mitigate warpage in the optical system. As shown in FIG. 7A, the stiffener rings 705 are added to the top and bottom sides of the substrate 150. That is, the stiffener ring 705A is disposed on a top side of the substrate 150 while the stiffener ring 705B is disposed on the bottom side of the substrate 150. The stiffener rings 705 are disposed around the periphery of the substrate 150 which provides rigidity and prevents or mitigates any warpage of the substrate 150. Preventing warpage can maintain or prevent damage to the bond between the substrate 150 and the package 135 as well as prevent internal damage to the substrate 150.

The top view in FIG. 7B illustrates the stiffener ring 705A extending around the periphery of the substrate 150. The package 135 is then connected to the package 135 in a central area defined by the stiffener ring 705A. In this manner, the stiffener ring 705A can be added to the optical system 700 while still permitting the substrate 150 to bonded to the package 135 and a socket (not shown) at its top and bottom sides.

The stiffener rings 705 can be made from any material (e.g., metal) that provides sufficient support to the substrate 150 to mitigate warpage. In one embodiment, the stiffener rings 705 are designed to have mechanical clearance for the edge coupler (e.g., the FAU). For example, the stiffener rings 705 may not extend to the side of the substrate 150 closest to the edge coupler, or the stiffener rings 705 may be recessed further from that side of the substrate 150 than the other sides.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. A system, comprising:
    a photonic integrated circuit (PIC);
    a package containing at least one electrical integrated circuit (EIC), wherein the package is bonded to a first side of the PIC such that an overhang of the PIC extends beyond the package and through silicon vias are formed through the at least one EIC; and
    an optical fiber optically aligned to a second side of the PIC that is on the overhang, wherein the second side is perpendicular to the first side of the PIC.

2. The system of claim 1, further comprising:
    an edge coupler contacting the second side of the PIC and configured to optically align the optical fiber to the second side.

3. The system of claim 2, wherein the edge coupler is a fiber array unit (FAU) configured to optically align a plurality of optical fibers to the second side.

4. The system of claim 3, wherein the package is recessed from the FAU.

5. The system of claim 1, wherein the package has a smaller width than the PIC.

6. The system of claim 1, wherein a thickness of the PIC is greater than 400 microns.

7. The system of claim 1, further comprising:
a substrate solder bonded to the package, the substrate defining an aperture in which a heat sink is inserted to establish a thermal connection with the at least one EIC.

8. The system of claim 1, wherein the at least one EIC transmits an electrical signal to and receives an electrical signal from an optical component in the PIC, wherein the optical component receives an optical signal from and transmits an optical signal to the optical fiber.

9. The system of claim 1, further comprising:
a second optical fiber optically aligned to a third side of the PIC that is parallel to the first side of the PIC.

10. A system, comprising:
a photonic integrated circuit (PIC);
a package containing multiple electrical integrated circuits (EIC) disposed side-by-side, wherein the package is bonded to a first side of the PIC such that an overhang of the PIC extends beyond the package;
an optical fiber optically aligned to a second side of the PIC that is on the overhang, wherein the second side is perpendicular to the first side of the PIC; and
the package comprises at least one decoupling capacitor disposed side-by-side with the multiple EICs.

11. A system, comprising:
a photonic integrated circuit (PIC);
a package containing multiple electrical integrated circuits (EIC) disposed side-by-side, wherein the package is bonded to a first side of the PIC such that an overhang of the PIC extends beyond the package;
an optical fiber optically aligned to a second side of the PIC that is on the overhang, wherein the second side is perpendicular to the first side of the PIC; the package comprises at least one decoupling capacitor or memory disposed side-by-side with the multiple EICs; and
a second optical fiber optically aligned to a third side of the PIC that is parallel to the first side of the PIC.

12. A system, comprising:
a photonic integrated circuit (PIC);
a package containing multiple electrical integrated circuits (EIC) disposed side-by-side, wherein the package is bonded to a first side of the PIC such that an overhang of the PIC extends beyond the package;
an optical fiber optically aligned to a second side of the PIC that is on the overhang, wherein the second side is perpendicular to the first side of the PIC;
the package comprises at least one decoupling capacitor or memory disposed side-by-side with the multiple EICs; and
a substrate solder bonded to the package, the substrate defining an aperture in which a heat sink is inserted to establish a thermal connection with at least one of the EICs.

13. A system, comprising:
a photonic integrated circuit (PIC);
a package containing multiple electrical integrated circuits (EIC) disposed side-by-side, wherein the package is bonded to a first side of the PIC such that an overhang of the PIC extends beyond the package;
an optical fiber optically aligned to a second side of the PIC that is on the overhang, wherein the second side is perpendicular to the first side of the PIC;
the package comprises at least one decoupling capacitor or memory disposed side-by-side with the multiple EICs; and
an edge coupler contacting the second side of the PIC and configured to optically align the optical fiber to the second side.

14. The system of claim 13, wherein the package is recessed from the edge coupler.

15. A system, comprising:
a photonic integrated circuit (PIC);
a package containing at least one electrical integrated circuit (EIC), wherein the package is bonded to a first side of the PIC such that an overhang of the PIC extends beyond the package;
an optical fiber optically aligned to a second side of the PIC that is on the overhang, wherein the second side is perpendicular to the first side of the PIC;
a first dam disposed on the PIC; and
a second dam disposed on the package, wherein the first and second dams block an underfill that is part of a bond between the PIC and the package from affecting an optical alignment between the PIC and the optical fiber.

16. The system of claim 15, further comprising:
a second optical fiber optically aligned to a third side of the PIC that is parallel to the first side of the PIC.

17. The system of claim 15, further comprising:
a substrate solder bonded to the package, the substrate defining an aperture in which a heat sink is inserted to establish a thermal connection with the at least one EIC.

18. The system of claim 15, further comprising:
an edge coupler contacting the second side of the PIC and configured to optically align the optical fiber to the second side.

19. The system of claim 18, wherein the edge coupler is a fiber array unit (FAU) configured to optically align a plurality of optical fibers to the second side.

20. The system of claim 18, wherein the package is recessed from the edge coupler.

* * * * *